United States Patent
Masuda et al.

(10) Patent No.: US 9,786,741 B2
(45) Date of Patent: Oct. 10, 2017

(54) SILICON CARBIDE SEMICONDUCTOR DEVICE AND METHOD FOR MANUFACTURING THE SAME

(71) Applicant: Sumitomo Electric Industries, Ltd., Osaka-shi (JP)

(72) Inventors: Takeyoshi Masuda, Osaka (JP); Taku Horii, Osaka (JP); Ryosuke Kubota, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/908,846

(22) PCT Filed: Jun. 13, 2014

(86) PCT No.: PCT/JP2014/065775
§ 371 (c)(1),
(2) Date: Jan. 29, 2016

(87) PCT Pub. No.: WO2015/015926
PCT Pub. Date: Feb. 5, 2015

(65) Prior Publication Data
US 2016/0181373 A1    Jun. 23, 2016

(30) Foreign Application Priority Data
Jul. 31, 2013 (JP) .................... 2013-159232

(51) Int. Cl.
*H01L 29/15* (2006.01)
*H01L 31/0312* (2006.01)
(Continued)

(52) U.S. Cl.
CPC .... *H01L 29/1608* (2013.01); *H01L 21/02529* (2013.01); *H01L 21/0465* (2013.01);
(Continued)

(58) Field of Classification Search
CPC ........... H01L 29/1608; H01L 29/66712; H01L 21/0465; H01L 21/02529; H01L 29/66333;
(Continued)

(56) References Cited

U.S. PATENT DOCUMENTS 9,620,428 B2 * 4/2017 Matocha ................. H01L 23/26
2012/0007104 A1 * 1/2012 Wada ................. H01L 21/0485
257/77
(Continued)

FOREIGN PATENT DOCUMENTS

JP     2006-066438 A     3/2006
JP     2006-303323 A     11/2006
(Continued)

OTHER PUBLICATIONS

International Search Report in PCT International Application No. PCT/JP2014/065775, dated Aug. 5, 2014.

*Primary Examiner* — Victor A Mandala
(74) *Attorney, Agent, or Firm* — Venable LLP; Michael A. Sartori; Laura G. Remus

(57) ABSTRACT

A silicon carbide semiconductor device includes a silicon carbide layer and a gate insulating layer. The silicon carbide layer has a main surface. The gate insulating layer is arranged as being in contact with the main surface of the silicon carbide layer. The silicon carbide layer includes a drift region having a first conductivity type, a body region having a second conductivity type different from the first conductivity type and being in contact with the drift region, a source region having the first conductivity type and arranged as being spaced apart from the drift region by the body region, and a protruding region arranged to protrude from at least one side of the source region and the drift
(Continued)

region into the body region, being in contact with the gate insulating layer, and having the first conductivity type.

20 Claims, 7 Drawing Sheets

(51) Int. Cl.
*H01L 29/16* (2006.01)
*H01L 29/78* (2006.01)
*H01L 29/66* (2006.01)
*H01L 29/739* (2006.01)
*H01L 29/08* (2006.01)
*H01L 21/02* (2006.01)
*H01L 21/04* (2006.01)
*H01L 29/10* (2006.01)

(52) U.S. Cl.
CPC ........ *H01L 29/086* (2013.01); *H01L 29/0865* (2013.01); *H01L 29/0869* (2013.01); *H01L 29/0878* (2013.01); *H01L 29/0886* (2013.01); *H01L 29/1095* (2013.01); *H01L 29/66068* (2013.01); *H01L 29/66333* (2013.01); *H01L 29/66712* (2013.01); *H01L 29/7395* (2013.01); *H01L 29/7802* (2013.01)

(58) Field of Classification Search
CPC ............. H01L 29/1095; H01L 29/0865; H01L 29/7395; H01L 29/086; H01L 29/0869; H01L 29/0878; H01L 29/0886; H01L 29/66068; H01L 29/7802

See application file for complete search history.

(56) References Cited

U.S. PATENT DOCUMENTS

| 2012/0184094 | A1* | 7/2012 | Yamada | H01L 29/45 438/586 |
| 2013/0161619 | A1* | 6/2013 | Wada | H01L 29/7393 257/52 |
| 2014/0034966 | A1* | 2/2014 | Nishio | H01L 29/1608 257/77 |
| 2015/0034971 | A1* | 2/2015 | Watanabe | H01L 29/66068 257/77 |
| 2015/0214164 | A1* | 7/2015 | Matocha | H01L 29/7811 257/77 |
| 2016/0149025 | A1* | 5/2016 | Mori | H01L 29/4925 257/77 |
| 2017/0005193 | A1* | 1/2017 | Ng | H01L 29/402 |

FOREIGN PATENT DOCUMENTS

| JP | 2006303323 | * | 11/2006 | .......... 29/78 |
| JP | 2012-124536 A | | 6/2012 | |
| JP | 2012-146838 A | | 8/2012 | |
| JP | 2012-235001 A | | 11/2012 | |

* cited by examiner

SILICON CARBIDE SEMICONDUCTOR DEVICE AND METHOD FOR MANUFACTURING THE SAME

TECHNICAL FIELD

The present invention relates to a silicon carbide semiconductor device and a method for manufacturing the same, and more particularly to a silicon carbide semiconductor device capable of achieving suppression of increase in specific on-resistance and an improved threshold voltage as well as to a method for manufacturing the same.

BACKGROUND ART

In order to allow a semiconductor device such as a metal oxide semiconductor field effect transistor (MOSFET) to be high in breakdown voltage and low in loss and to be used in a high-temperature environment, silicon carbide has recently increasingly been adopted as a material forming a semiconductor device. Silicon carbide is a wide band gap semiconductor greater in band gap than silicon which has conventionally widely been used as a material forming a semiconductor device. Therefore, by adopting silicon carbide as a material forming a semiconductor device, a higher breakdown voltage and a lower on-resistance of a semiconductor device can be achieved. A semiconductor device in which silicon carbide has been adopted as a material is also advantageous in that lowering in characteristics during use in a high-temperature environment is less than in a semiconductor device in which silicon has been adopted as a material.

For example, Japanese Patent Laying-Open No. 2012-146838 (PTD 1) describes a MOSFET having an n-type source region, a p-type body region, and an n-type SiC region. According to the MOSFET described in Japanese Patent Laying-Open No. 2012-146838, as a voltage is applied to a gate voltage, an inversion layer is formed in a channel region in the p-type body region directly under a gate insulating film and a current flows between a source electrode and a drain electrode.

CITATION LIST

Patent Document

PTD 1: Japanese Patent Laying-Open No. 2012-146838

SUMMARY OF INVENTION

Technical Problem

Since a specific on-resistance increases with a longer length of a channel region (a channel length), a channel length is desirably short from a point of view of the specific on-resistance. When a channel length is decreased, however, a threshold voltage is lowered. Therefore, from a point of view of a threshold voltage, a channel length is desirably long. There is a trade-off between the threshold voltage and the specific on-resistance. In designing a channel length such that a threshold voltage is higher in a MOSFET having a structure described in Japanese Patent Laying-Open No. 2012-146838, it has been difficult to sufficiently lower a specific on-resistance.

The present invention was made to solve such a problem, and an object thereof is to provide a silicon carbide semiconductor device capable of achieving suppression of increase in specific on-resistance and an improved threshold voltage and a method for manufacturing the same.

Solution to Problem

A silicon carbide semiconductor device according to the present invention includes a silicon carbide layer and a gate insulating layer. The silicon carbide layer has a main surface. The gate insulating layer is arranged as being in contact with the main surface of the silicon carbide layer. The silicon carbide layer includes a drift region having a first conductivity type, a body region having a second conductivity type different from the first conductivity type and being in contact with the drift region, a source region having the first conductivity type and arranged as being spaced apart from the drift region by the body region, and a protruding region arranged to protrude from at least one side of the source region and the drift region into the body region, being in contact with the gate insulating layer, and having the first conductivity type.

A method for manufacturing a silicon carbide semiconductor device according to the present invention includes the steps below. A silicon carbide layer having a main surface is formed. A gate insulating layer in contact with the main surface of the silicon carbide layer is formed. The silicon carbide layer includes a drift region having a first conductivity type, a body region having a second conductivity type different from the first conductivity type and being in contact with the drift region, a source region having the first conductivity type and arranged as being spaced apart from the drift region by the body region, and a protruding region arranged to protrude from at least one side of the source region and the drift region into the body region, being in contact with the main surface, and having the first conductivity type.

Advantageous Effects of Invention

As is clear from the description above, according to the present invention, a silicon carbide semiconductor device capable of achieving suppression of increase in specific on-resistance and an improved threshold voltage as well as a method of manufacturing the same can be provided.

DESCRIPTION OF EMBODIMENTS

Figure 1:
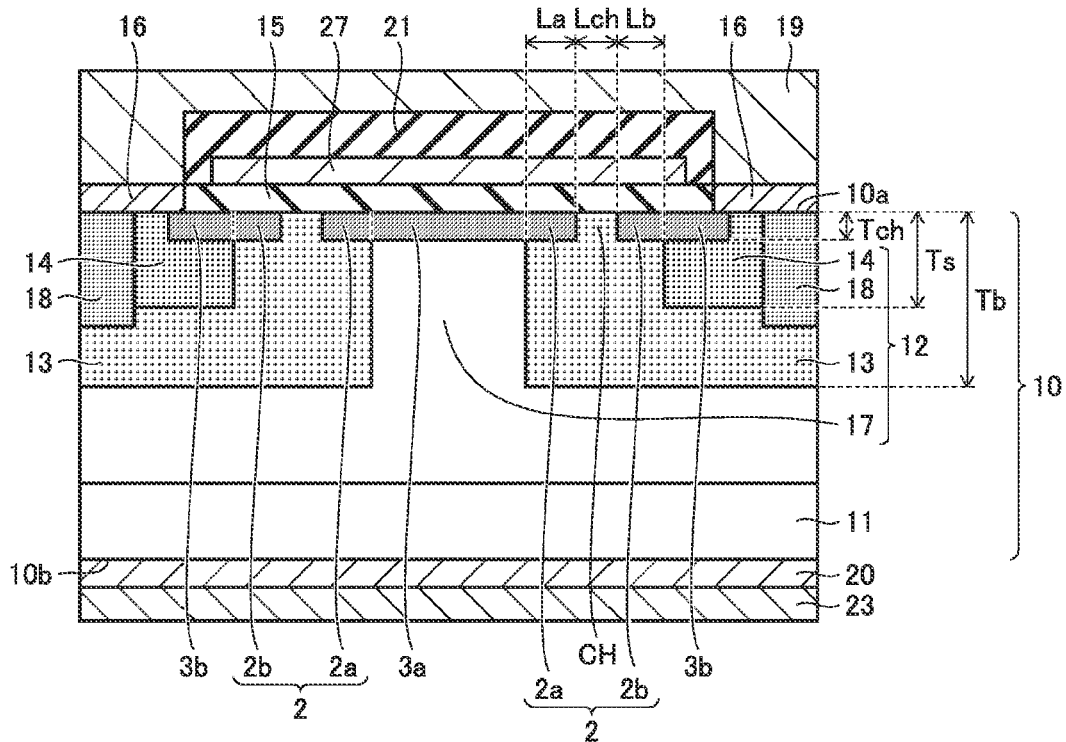
FIG. 1 is a schematic cross-sectional view schematically showing a structure of a silicon carbide semiconductor device according to one embodiment of the present invention.

An embodiment of the present invention will be described hereinafter with reference to the drawings. In the drawings below, the same or corresponding elements have the same reference characters allotted and description thereof will not be repeated. In addition, regarding crystallographic denotation herein, an individual orientation, a group orientation, an individual plane, and a group plane are shown in [ ], < >, ( ), and { }, respectively. Moreover, a crystallographically negative index is normally expressed by a number with a bar "-" thereabove, however, a negative sign herein precedes a number. In expressing an angle, a system in which a total azimuth angle is defined as 360 degrees is employed.

Overview of an embodiment of the present invention will initially be described.

As a result of dedicated studies about a trade-off between a specific on-resistance and a threshold voltage, the inventors have obtained the finding below and found the present invention. Initially, when a channel length is decreased in a MOSFET of a conventional type having the structure described in Japanese Patent Laying-Open No. 2012-146838, because of a short-channel effect, a barrier is lowered and a threshold voltage lowers. When a channel length is decreased to some extent, a specific on-resistance is not much lowered but a threshold voltage significantly lowers. As a result of dedicated studies, the inventors have found that, when a channel length is decreased by forming a protruding region arranged to protrude from at least one of a source region and a drift region into a body region, being in contact with a gate insulating layer, and being different in conductivity type from the body region, the channel length can effectively be decreased while a barrier is maintained high. Consequently, a silicon carbide semiconductor device achieving suppressed increase in specific on-resistance and a high threshold voltage can be obtained.

Figure 5:
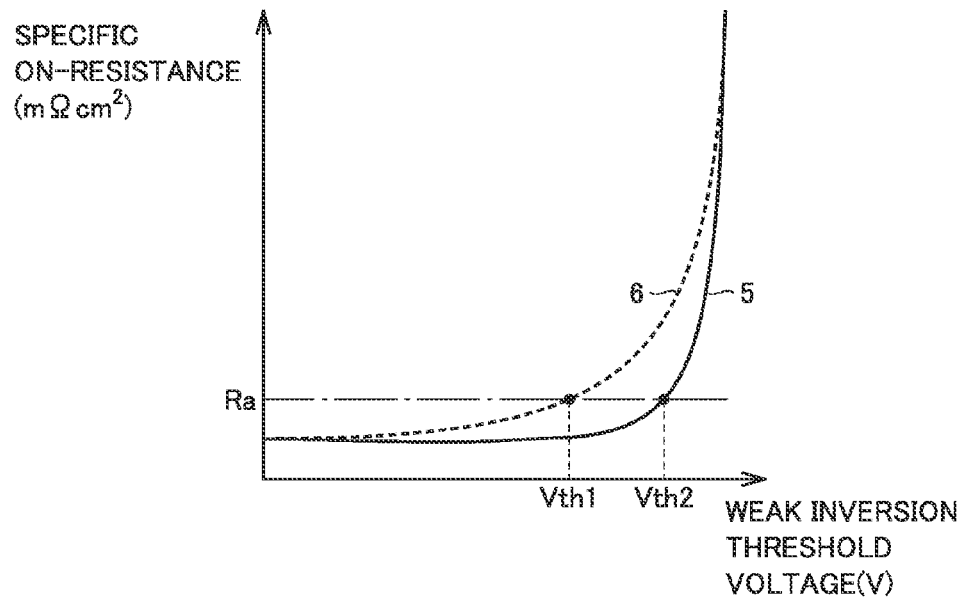
FIG. 5 is a diagram showing relation between a specific on-resistance and a weak inversion threshold voltage of silicon carbide semiconductor devices according to a comparative example and one embodiment of the present invention.

Referring to FIG. 5, relation between a specific on-resistance and a weak inversion threshold voltage in a MOSFET of a conventional type is shown with a dashed line 6, and relation between a specific on-resistance and a weak inversion threshold voltage in a MOSFET according to the present embodiment is shown with a solid line 5. Desirable characteristics of a MOSFET include a high weak inversion threshold voltage and a low specific on-resistance. For example, when a specific on-resistance is at Ra, a threshold voltage of the conventional MOSFET is at Vth1, whereas a threshold voltage of the MOSFET according to the present embodiment is at Vth2 higher than Vth1. Namely, according to the MOSFET in the present embodiment, a threshold voltage can be improved while increase in specific on-resistance is suppressed.

(1) A silicon carbide semiconductor device according to the embodiment includes a silicon carbide layer 10 and a gate insulating layer 15. Silicon carbide layer 10 has a main surface 10a. Gate insulating layer 15 is arranged as being in contact with main surface 10a of silicon carbide layer 10. Silicon carbide layer 10 includes a drift region 17 having a first conductivity type, a body region 13 having a second conductivity type different from the first conductivity type and being in contact with drift region 17, a source region 14 having the first conductivity type and arranged as being spaced apart from drift region 17 by body region 13, and a protruding region 2 arranged to protrude from at least one side of source region 14 and drift region 17 into body region 13, being in contact with gate insulating layer 15, and having the first conductivity type.

According to the silicon carbide semiconductor device in the embodiment, silicon carbide layer 10 includes protruding region 2 arranged to protrude from at least one side of source region 14 and drift region 17 into body region 13, being in contact with gate insulating layer 15, and having the first conductivity type. Thus, a threshold voltage can be improved while increase in specific on-resistance of the silicon carbide semiconductor device is suppressed.

(2) In the silicon carbide semiconductor device according to the embodiment, preferably, protruding region 2 includes a first protruding region 2a arranged to protrude from a side of drift region 17 into body region 13 and a second protruding region 2b arranged to protrude from a side of source region 14 into body region 13. Thus, effectively, a threshold voltage can be improved while increase in specific on-resistance of the silicon carbide semiconductor device is suppressed.

(3) In the silicon carbide semiconductor device according to the embodiment, preferably, a dimension La of first protruding region 2a along a direction in parallel to main surface 10a is greater than a dimension Tch of the first protruding region along a direction perpendicular to the main surface and a dimension Lb of second protruding region 2b along the direction in parallel to the main surface is greater than dimension Tch of the second protruding region along the direction perpendicular to the main surface. Thus, an electron or hole pull effect in a portion of first protruding region 2a and second protruding region 2b opposite to a side in contact with main surface 10a is higher than an electron or hole pull effect in a portion of first protruding region 2a and second protruding region 2b on a side of a channel region. Therefore, extension of a depletion layer extending from each of first protruding region 2a and second protruding region 2b toward the channel region can be lessened.

(4) In the silicon carbide semiconductor device according to the embodiment, preferably, dimension Tch of each of first protruding region 2a and first protruding region 2b along the direction perpendicular to main surface 10a is smaller than half a dimension Ts of source region 14 along the direction perpendicular to main surface 10a. Thus, a threshold voltage can be improved while increase in specific on-resistance of the silicon carbide semiconductor device is suppressed.

(5) In the silicon carbide semiconductor device according to the embodiment, preferably, dimension Tch of each of first protruding region 2a and second protruding region 2b along the direction perpendicular to main surface 10a is smaller than 100 nm. Thus, the protruding region is more likely to allow the depletion layer to extend in a vertical direction, while the depletion layer is less likely to extend in a horizontal direction. Therefore, a short-channel effect can be suppressed.

(6) In the silicon carbide semiconductor device according to the embodiment, preferably, in body region 13, a length of a channel region CH being in contact with main surface 10a and lying between first protruding region 2a and second protruding region 2b is smaller than 0.5 µm. Thus, a specific on-resistance can effectively be lowered.

(7) In the silicon carbide semiconductor device according to the embodiment, preferably, in body region 13, a length of channel region CH being in contact with main surface 10a and lying between first protruding region 2a and second protruding region 2b is smaller than a length Lch1 of the channel region corresponding to a threshold voltage Vth3 which is 90% of an ideal threshold voltage Vth4. Thus, a resistance in the channel region can be lowered.

(8) In the silicon carbide semiconductor device according to the embodiment, preferably, protruding region 2 is arranged to protrude from one side of source region 14 and drift region 17 into body region 13. Thus, a threshold voltage can be improved while increase in specific on-resistance of the silicon carbide semiconductor device is suppressed.

(9) In the silicon carbide semiconductor device according to the embodiment, preferably, protruding region 2 is arranged to protrude from a side of drift region 17 into body region 13, and silicon carbide layer 10 further includes a first-conductivity-type region 3a protruding from protruding region 2 into drift region 17, being in contact with gate insulating layer 15, and being higher in impurity concentration than drift region 17. Thus, a specific on-resistance can effectively be lowered.

(10) In the silicon carbide semiconductor device according to the embodiment, preferably, dimension La of protruding region 2 along the direction in parallel to main surface 10a is greater than dimension Tch of protruding region 2 along the direction perpendicular to main surface 10a. Thus, an electron or hole pull effect in a portion of protruding region 2 opposite to a side in contact with main surface 10a is higher than an electron or hole pull effect in a portion of protruding region 2 on a side of the channel region. Therefore, extension of a depletion layer extending from protruding region 2 toward the channel region can be lessened.

(11) In the silicon carbide semiconductor device according to the embodiment, preferably, dimension Tch of protruding region 2 along the direction perpendicular to main surface 10a is smaller than half dimension Ts of source region 14 along the direction perpendicular to main surface 10a. Thus, a threshold voltage can be improved while increase in specific on-resistance of the silicon carbide semiconductor device is suppressed.

(12) In the silicon carbide semiconductor device according to the embodiment, preferably, dimension Tch of protruding region 2 along the direction perpendicular to main surface 10a is smaller than 100 nm. Thus, the protruding region is more likely to allow the depletion layer to extend in the vertical direction, while the depletion layer is less likely to extend in the horizontal direction. Therefore, a short-channel effect can be suppressed.

(13) In the silicon carbide semiconductor device according to the embodiment, preferably, in body region 13, a length of channel region CH being in contact with main surface 10a and lying between protruding region 2 and an end portion 13c, 13d of body region 13 opposed to protruding region 2 is smaller than 0.5 µm. Thus, a specific on-resistance can effectively be lowered.

(14) In the silicon carbide semiconductor device according to the embodiment, preferably, in body region 13, a length of channel region CH being in contact with main surface 10a and lying between protruding region 2 and end portion 13c, 13d of body region 13 opposed to protruding region 2 is smaller than length Lch1 of the channel region corresponding to threshold voltage Vth3 which is 90% of ideal threshold voltage Vth4. Thus, a resistance in the channel region can be lowered.

(15) In the silicon carbide semiconductor device according to the embodiment, preferably, protruding region 2 is higher in impurity concentration than body region 13. When the region has a p conductivity type, the impurity concentration refers to a concentration of an acceptor, and when the region has an n conductivity type, the impurity concentration refers to a concentration of a donor. Thus, the protruding region can be formed after the body region is formed.

(16) In the silicon carbide semiconductor device according to the embodiment, preferably, an n-type is defined as the first conductivity type and a p-type is defined as the second conductivity type. Thus, ease in manufacturing of a silicon carbide semiconductor device can be improved.

(17) A method for manufacturing a silicon carbide semiconductor device according to the embodiment includes the steps below. Silicon carbide layer 10 having main surface 10a is formed. Gate insulating layer 15 in contact with main surface 10a of silicon carbide layer 10 is formed. Silicon carbide layer 10 includes drift region 17 having the first conductivity type, body region 13 having the second conductivity type different from the first conductivity type and being in contact with drift region 17, source region 14 having the first conductivity type and arranged as being spaced apart from drift region 17 by body region 13, and protruding region 2 arranged to protrude from at least one side of source region 14 and drift region 17 into body region 13, being in contact with main surface 10a, and having the first conductivity type.

According to the method for manufacturing a silicon carbide semiconductor device in the embodiment, protruding region 2 arranged to protrude from at least one side of source region 14 and drift region 17 into body region 13, being in contact with main surface 10a, and having the first conductivity type is included. Thus, a threshold voltage can be improved while increase in specific on-resistance of the silicon carbide semiconductor device is suppressed.

(18) In the method for manufacturing a silicon carbide semiconductor device according to the embodiment, preferably, the step of forming silicon carbide layer 10 includes the steps of forming a mask layer 4 in contact with body region 13 at main surface 10a and forming protruding region 2 in contact at least with body region 13 by using mask layer 4. When protruding region 2 is not included, a channel length is determined by a position of a boundary between the source region and the body region and a position of a boundary between the body region and the drift region. Namely, since a channel length is affected by misalignment of both of the source region and the body region, variation in channel length is great. When protruding region 2 is formed with the use of mask layer 4, a channel length is controlled by a width of mask layer 4. Therefore, variation in channel length can be lessened.

(19) In the method for manufacturing a silicon carbide semiconductor device according to the embodiment, preferably, the step of forming protruding region 2 includes the steps of forming first protruding region 2a arranged to protrude from a side of drift region 17 into body region 13 and forming first-conductivity-type region 3a protruding from first protruding region 2a into drift region 17, being in contact with main surface 10a, and being higher in impurity concentration than drift region 17, and the step of forming first protruding region 2a and the step of forming first-conductivity-type region 3a are simultaneously performed. Thus, a silicon carbide semiconductor device capable of achieving effective lowering in specific on-resistance can efficiently be manufactured.

(20) In the method for manufacturing a silicon carbide semiconductor device according to the embodiment, preferably, the step of forming protruding region 2 is performed by implanting ions. Thus, protruding region 2 can efficiently be formed.

The embodiment of the present invention will now be described in further detail.

Referring to FIG. 1, a MOSFET 1 representing one example of a silicon carbide semiconductor device in the present embodiment mainly has silicon carbide layer 10, gate insulating layer 15, a gate electrode 27, a source contact electrode 16, a drain electrode 20, an interlayer insulating film 21, a source interconnection 19, and a pad electrode 23.

Silicon carbide layer 10 is composed, for example, of hexagonal silicon carbide having a polytype 4H. Main surface 10a of silicon carbide layer 10 may be a surface angled off approximately by at most 8° relative to a {0001} plane or may be a {0-33-8} plane.

Silicon carbide layer 10 mainly includes a base substrate 11, drift region 17, body region 13, source region 14, a p$^+$ region 18, protruding region 2, a first n$^+$ region 3a, and a second n$^+$ region 3b. Base substrate 11 is a silicon carbide single crystal substrate composed of silicon carbide and having the n conductivity type (the first conductivity type). Drift region 17 is a silicon carbide epitaxial layer arranged on base substrate 11 and drift region 17 has the n conductivity type. An impurity contained in drift region 17 is, for example, nitrogen (N). A concentration of nitrogen contained in drift region 17 is, for example, approximately $5 \times 10^{15}$ cm$^{-3}$. Drift region 17 includes a JFET region lying between a pair of body regions 13 which will be described later.

Body region 13 is in contact with drift region 17 and first main surface 10a. Body region 13 has the p-type (the second conductivity type). Body region 13 contains such an impurity (acceptor) as aluminum or boron. A concentration of the acceptor contained in body region 13 is, for example, approximately not lower than $4 \times 10^{16}$ cm$^{-3}$ and not higher than $4 \times 10^{18}$ cm$^{-3}$. A concentration of the impurity (acceptor) contained in body region 13 is higher than a concentration of the impurity (donor) contained in drift region 17.

Source region 14 is in contact with body region 13 and first main surface 10a and spaced apart from drift region 17 by body region 13. Source region 14 is formed to be surrounded by body region 13. Source region 14 has the n-type. Source region 14 contains such an impurity (donor) as phosphorus (P). A concentration of the impurity (donor) contained in source region 14 is, for example, approximately $1 \times 10^{18}$ cm$^{-3}$. A concentration of the impurity (donor) contained in source region 14 is higher than a concentration of the impurity (acceptor) contained in body region 13 and higher than a concentration of the impurity (donor) contained in drift region 17.

P$^+$ region 18 is arranged as being in contact with first main surface 10a, source region 14, and body region 13. P$^+$ region 18 is formed to be surrounded by source region 14 and to extend from first main surface 10a to body region 13. P$^+$ region 18 is a p-type region containing such an impurity (acceptor) as Al. A concentration of the impurity (acceptor) contained in p$^+$ region 18 is higher than a concentration of the impurity (acceptor) contained in body region 13. A concentration of the impurity (acceptor) in p$^+$ region 18 is, for example, approximately $1 \times 10^{20}$ cm$^{-3}$.

Protruding region 2 is arranged to protrude from at least one side of source region 14 and drift region 17 into body region 13. Protruding region 2 is in contact with gate insulating layer 15 and has the n-type (the first conductivity type). Protruding region 2 contains an impurity (donor) such as phosphorus. A concentration of the impurity (donor) contained in protruding region 2 is higher than a concentration of the impurity (acceptor) contained in body region 13. A concentration of the impurity (donor) contained in protruding region 2 is, for example, approximately $1 \times 10^{18}$ cm$^{-3}$. Preferably, a concentration of the impurity (donor) contained in protruding region 2 is, for example, approximately not lower than $5 \times 10^{17}$ cm$^{-3}$ and not higher than $2 \times 10^{19}$ cm$^{-3}$.

Preferably, dimensions La and Lb of protruding regions 2 along the direction in parallel to first main surface 10a are greater than dimension Tch of protruding region 2 along the direction perpendicular to first main surface 10a. More preferably, dimensions La and Lb of protruding regions 2 are at least twice as large as dimension Tch of protruding region 2 along the direction perpendicular to first main surface 10a. Further preferably, dimension Tch of protruding region 2 along the direction perpendicular to first main surface 10a is smaller than half dimension Ts of source region 14 along the direction perpendicular to first main surface 10a. Dimension Tch of protruding region 2 is, for example, approximately not smaller than 30 nm and not greater than 200 nm. Dimension Ts of source region 14 is, for example, approximately not smaller than 200 nm and not greater than 400 nm. A dimension Tb of body region 13 along the direction perpendicular to first main surface 10a is, for example, approximately not smaller than 0.8 µm and not greater than 1.2 µm.

Preferably, protruding region 2 includes first protruding region 2a arranged to protrude from a side of drift region 17 into body region 13 and second protruding region 2b arranged to protrude from a side of source region 14 into body region 13. Dimension La of first protruding region 2a along the direction in parallel to first main surface 10a is, for example, approximately not smaller than (200) nm and (1000) nm, and dimension Lb of second protruding region 2b along the direction in parallel to first main surface 10a is, for example, approximately not smaller than (200) nm and not greater than (1000) nm. Dimension Tch of first protruding region 2a and second protruding region 2b along the direction perpendicular to first main surface 10a is, for example, approximately not greater than 100 nm. In body region 13, a length Lch of channel region CH being in contact with first main surface 10a and lying between first protruding region 2a and second protruding region 2b is, for example, approximately not smaller than 0.2 μm and not greater than 0.6 μm and preferably smaller than 0.5 μm. The total of dimension La of first protruding region 2a, dimension Lb of second protruding region 2b, and length Lch of channel region CH is approximately not smaller than 0.6 μm and not greater than 1.2 μm. In the MOSFET shown in FIG. 1, length Lch of channel region CH corresponds to a dimension of a region lying between first protruding region 2a and second protruding region 2b along the direction in parallel to first main surface 10a.

Dimension La of first protruding region 2a along the direction in parallel to first main surface 10a may be greater than dimension Tch of first protruding region 2a along the direction perpendicular to first main surface 10a. Dimension Lb of second protruding region 2b along the direction in parallel to first main surface 10a may be greater than dimension Tch of second protruding region 2b along the direction perpendicular to first main surface 10a. Dimension Tch of at least one of first protruding region 2a and second protruding region 2b along the direction perpendicular to first main surface 10a may be smaller than half dimension Ts of source region 14 along the direction perpendicular to first main surface 10a, or dimension Tch of each of first protruding region 2a and second protruding region 2b along the direction perpendicular to first main surface 10a may be smaller than half dimension Ts of source region 14 along the direction perpendicular to first main surface 10a. Dimension Tch of at least one of first protruding region 2a and second protruding region 2b along the direction perpendicular to first main surface 10a may be smaller than 100 nm, or dimension Tch of each of first protruding region 2a and second protruding region 2b along the direction perpendicular to first main surface 10a may be smaller than 100 nm.

Figure 6:
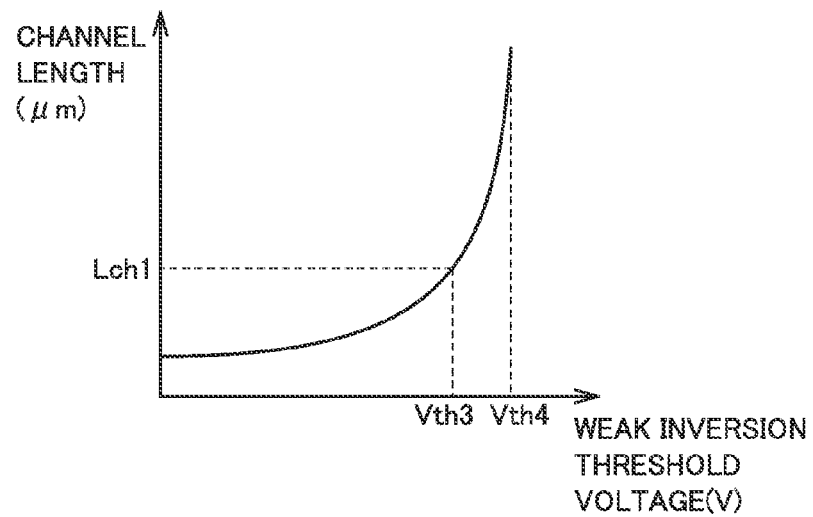
FIG. 6 is a diagram showing relation between a channel length and a weak inversion threshold voltage of the silicon carbide semiconductor device according to one embodiment of the present invention.

Relation between channel length Lch and a weak inversion threshold voltage will be described with reference to FIG. 6. As shown in FIG. 6, with increase in channel length Lch, a threshold voltage is higher. When a channel length is greater than a certain level, however, the threshold voltage does not increase over a certain value. Namely, the threshold voltage is asymptotic to a certain threshold voltage Vth4 when a channel length is increased. This threshold voltage Vth is called an ideal threshold voltage. When a threshold voltage which is 90% of ideal threshold voltage Vth4 is defined as Vth3, channel length Lch1 corresponding to Vth3 is determined based on relation between the channel length and the threshold voltage. Channel length Lch in MOSFET 1 is preferably smaller than channel length Lch1 corresponding to threshold voltage Vth3 which is 90% of ideal threshold voltage Vth4.

Silicon carbide layer 10 may include first n$^+$ region 3a protruding from first protruding region 2a into drift region 17, being in contact with gate insulating layer 15, and being higher in impurity concentration than drift region 17. First n$^+$ region 3a is arranged as lying between drift region 17 and gate insulating layer 15. As shown in FIG. 1, when silicon carbide layer 10 has a pair of body regions 13 opposed to each other in a cross-sectional view, first n$^+$ region 3a may be formed such that drift region 17 lying between one body region 13 and the other body region 13 is spaced apart from gate insulating layer 15 with first n$^+$ region 3a being interposed. First n$^+$ region 3a may be similar in impurity concentration to second protruding region 2b.

Silicon carbide layer 10 may include second n$^+$ region 3b extending from second protruding region 2b to source region 14, being in contact with gate insulating layer 15, and being higher in impurity concentration than drift region 17. Second n$^+$ region 3b is arranged as lying between source region 14 and gate insulating layer 15. Second n$^+$ region 3b may be similar in impurity concentration to second protruding region 2b.

Gate insulating layer 15 is arranged as being in contact with body region 13, first protruding region 2a, second protruding region 2b, first n$^+$ region 3a, and second n$^+$ region 3b, at first main surface 10a of silicon carbide layer 10. Gate insulating layer 15 is composed, for example, of silicon dioxide. Gate insulating layer 15 has a thickness, for example, around 50 nm.

Gate electrode 27 is arranged to be opposed to body region 13, first protruding region 2a, second protruding region 2b, first n$^+$ region 3a, and second n$^+$ region 3b, with gate insulating layer 15 being interposed. Gate electrode 27 is arranged as being in contact with gate insulating layer 15 such that gate insulating layer 15 lies between gate electrode 27 and silicon carbide layer 10. Gate electrode 27 is composed, for example, of polysilicon to which an impurity has been added or such a conductor as aluminum.

Source contact electrode 16 is arranged as being in contact with source region 14, p$^+$ region 18, and gate insulating layer 15. Source contact electrode 16 may be in contact with second n$^+$ region 3b. Source contact electrode 16 is composed of a material which can establish ohmic contact with source region 14, such as NiSi (nickel silicide). Source contact electrode 16 may be composed of a material including Ti, Al, and Si.

Drain electrode 20 is formed to be in contact with a second main surface 10b of silicon carbide layer 10. This drain electrode 20 is composed of a material which can establish ohmic contact with n-type base substrate 11, such as NiSi, and electrically connected to base substrate 11. Pad electrode 23 is arranged as being in contact with drain electrode 20.

Interlayer insulating film 21 is formed to be in contact with gate insulating layer 15 and to surround gate electrode 27. Interlayer insulating film 21 is composed, for example, of silicon dioxide representing an insulator. Source interconnection 19 surrounds interlayer insulating film 21 at a position opposed to first main surface 10a of silicon carbide layer 10 and is in contact with an upper surface of source contact electrode 16. Source interconnection 19 is composed of such a conductor as Al and electrically connected to source region 14 with source contact electrode 16 being interposed.

Figure 2:
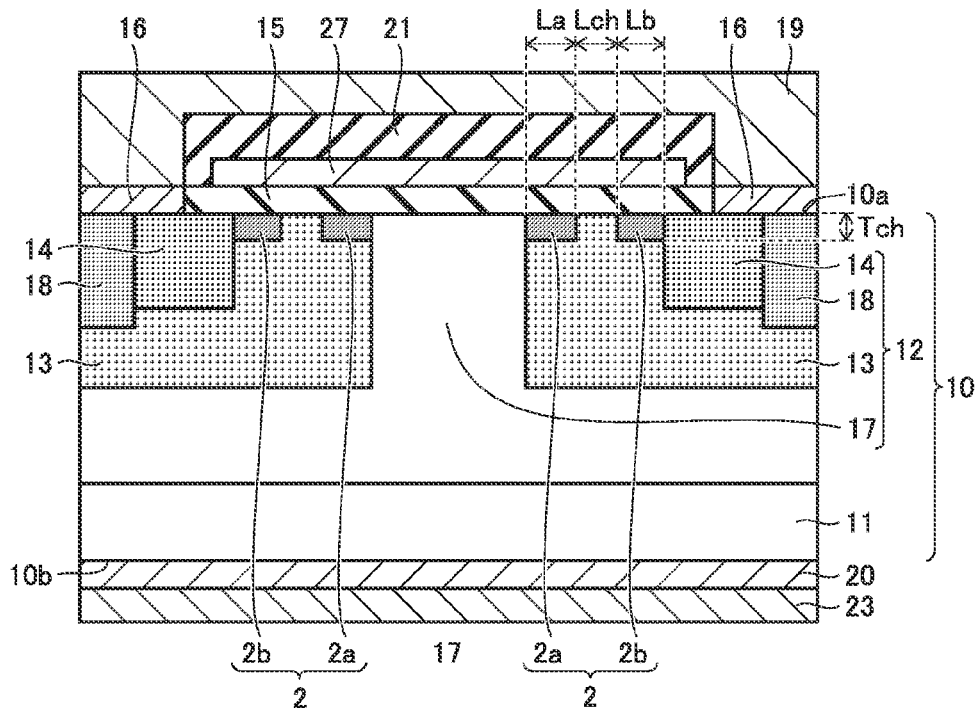
FIG. 2 is a schematic cross-sectional view schematically showing a structure of a first modification of the silicon carbide semiconductor device according to one embodiment of the present invention.

Referring to FIG. 2, silicon carbide layer 10 of MOSFET 1 has first protruding region 2a protruding from the side of drift region 17 into body region 13 and does not have to have first n$^+$ region 3a protruding from body region 13 into drift region 17. Similarly, silicon carbide layer 10 of MOSFET 1 has second protruding region 2b protruding from the side of source region 14 into body region 13 and does not have to have second n$^+$ region 3b protruding from body region 13 into source region 14.

Figure 3:
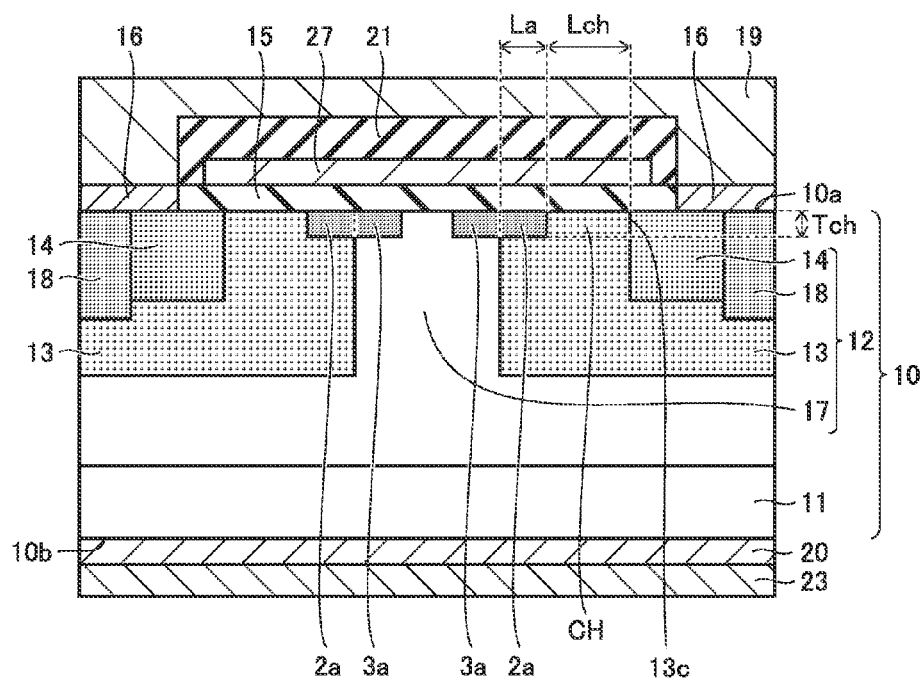
FIG. 3 is a schematic cross-sectional view schematically showing a structure of a second modification of the silicon carbide semiconductor device according to one embodiment of the present invention.

Referring to FIG. 3, silicon carbide layer 10 of MOSFET 1 has first protruding region 2a protruding from the side of drift region 17 into body region 13 and may have first n$^+$ region 3a protruding from body region 13 into drift region 17. Silicon carbide layer 10 of MOSFET 1 does not have to have second protruding region 2b protruding from the side of source region 14 into body region 13. As shown in FIG. 3, drift region 17 may be arranged between two first n$^+$ regions 3a opposed to each other in a cross-sectional view (a field of view along the direction in parallel to first main surface 10a) and drift region 17 may be in contact with gate insulating layer 15. In the MOSFET shown in FIG. 3, length Lch of channel region CH corresponds to a dimension along the direction in parallel to first main surface 10a, of the region in body region 13 which is in contact with first main surface 10a and lies between first protruding region 2a and end portion 13c of body region 13 opposed to first protruding region 2a. In other words, length Lch of channel region CH corresponds to a dimension of the region lying between first protruding region 2a and source region 14 in the direction in parallel to first main surface 10a.

Figure 4:
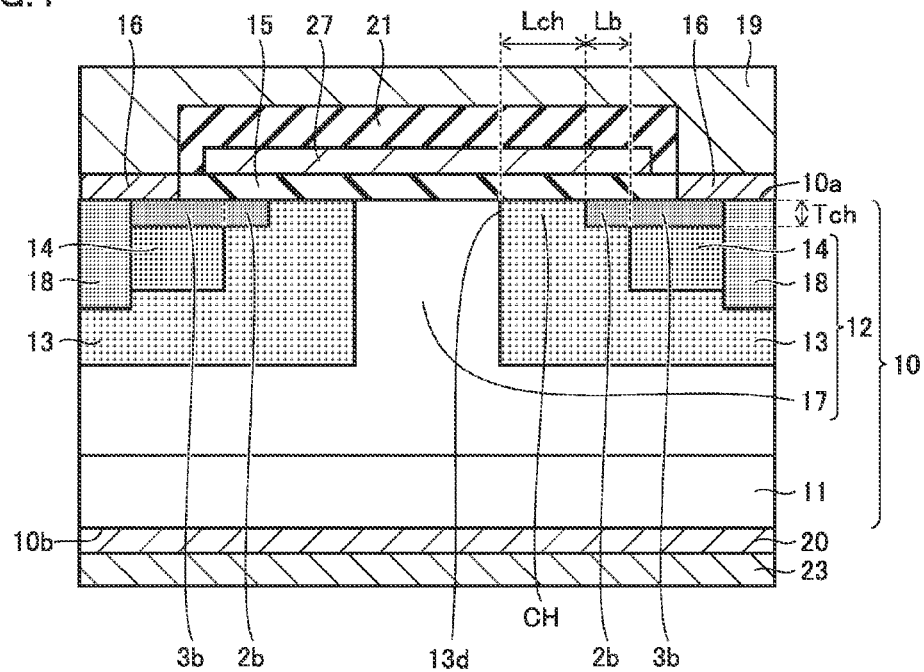
FIG. 4 is a schematic cross-sectional view schematically showing a structure of a third modification of the silicon carbide semiconductor device according to one embodiment of the present invention.

Referring to FIG. 4, silicon carbide layer 10 of MOSFET 1 may have second protruding region 2b protruding from the side of source region 14 into body region 13. Silicon carbide layer 10 may have second $n^+$ region 3b protruding from second protruding region 2b into source region 14 and being in contact with $p^+$ region 18. Silicon carbide layer 10 of MOSFET 1 does not have to have first protruding region 2a protruding from the side of drift region 17 into body region 13. In the MOSFET shown in FIG. 4, length Lch of channel region CH corresponds to a dimension along the direction in parallel to first main surface 10a, of a region in body region 13, which is in contact with first main surface 10 and lies between second protruding region 2b and end portion 13d of body region 13 opposed to second protruding region 2b. In other words, length Lch of channel region CH corresponds to a dimension of the region lying between second protruding region 2b and drift region 17 along the direction in parallel to first main surface 10a.

An operation of MOSFET 1 will now be described. Referring to FIG. 1, when a voltage of gate electrode 27 is lower than a threshold voltage, that is, in an off state, a pn junction between body region 13 and drift region 17 located directly under gate insulating layer 15 is reverse biased and is in a non-conducting state. When a voltage not lower than the threshold voltage is applied to gate electrode 27, an inversion layer is formed in channel region CH around a portion of contact of body region 13 with gate insulating layer 15. Consequently, source region 14 and drift region 17 are electrically connected to each other and a current flows between source interconnection 19 and drain electrode 20.

One example of a method for manufacturing MOSFET 1 in the present embodiment will now be described with reference to FIGS. 7 to 12.

Figure 7:
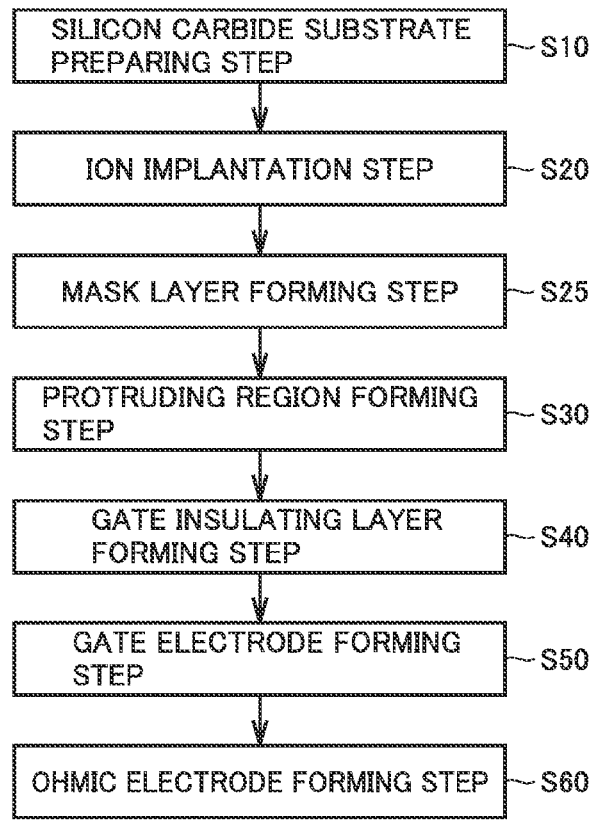
FIG. 7 is a flowchart schematically showing a method for manufacturing a silicon carbide semiconductor device according to one embodiment of the present invention.
Figure 8:
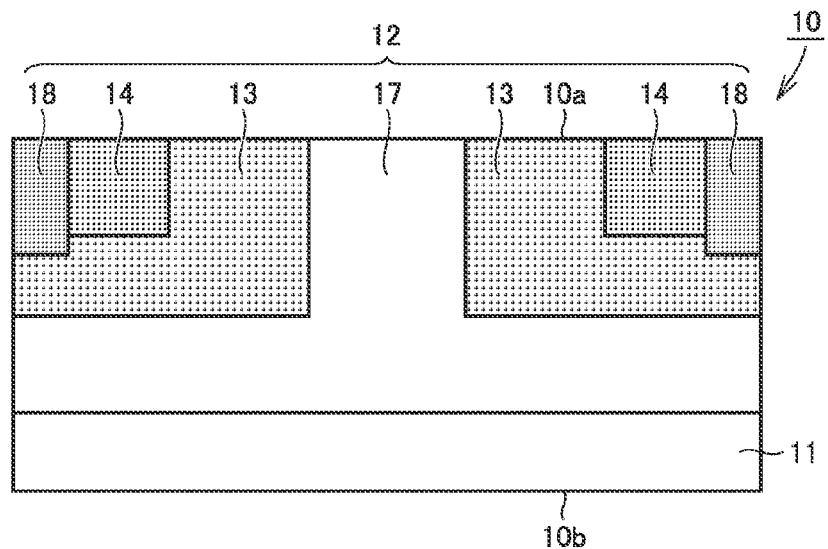
FIG. 8 is a schematic cross-sectional view schematically showing a first step in the method for manufacturing a silicon carbide semiconductor device according to one embodiment of the present invention.
Figure 9:
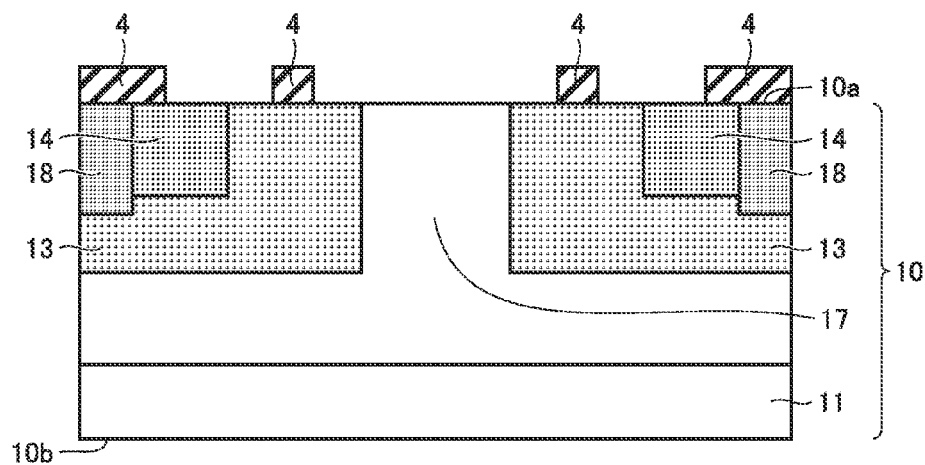
FIG. 9 is a schematic cross-sectional view schematically showing a second step in the method for manufacturing a silicon carbide semiconductor device according to one embodiment of the present invention.

Initially, a silicon carbide substrate preparing step (S10: FIG. 7) is performed. Specifically, for example, base substrate 11 having polytype 4H and composed of hexagonal silicon carbide is prepared and drift region 17 having the n-type (the first conductivity type) is formed on base substrate 11 through epitaxial growth. Drift region 17 contains an impurity such as N (nitrogen) ions.

Then, an ion implantation forming step (S20: FIG. 7) is performed. Specifically, referring to FIG. 8, for example, Al (aluminum) ions are implanted into drift region 17 so that body region 13 is formed. Then, ions are implanted for forming source region 14. Specifically, for example, P (phosphorus) ions are implanted into body region 13 so that source region 14 is formed in body region 13. In addition, ions are implanted for forming $p^+$ region 18. Specifically, for example, Al ions are implanted into body region 13 so that $p^+$ region 18 in contact with source region 14 is formed in body region 13. Ions can be implanted, for example, by forming a mask layer composed of silicon dioxide and having an opening in a desired region into which ions are to be implanted on main surface 10a of drift region 17 and implanting ions with the use of the mask layer.

Then, a mask layer forming step (S25: FIG. 7) is performed. In the mask layer forming step, mask layer 4 in contact with body region 13 at first main surface 10a is formed. Specifically, referring to FIG. 9, mask layer 4 covering a region in body region 13 to be channel region CH and having an opening portion over conductive regions which are opposed to each other with channel region CH being interposed. More specifically, mask layer 4 is formed on first main surface 10a of silicon carbide layer 10 so as to be in contact with a part of body region 13 at first main surface 10a and to cover the entire surface of $p^+$ region 18 and a part of source region 14. A dimension of mask layer 4 formed on body region 13 along the direction in parallel to first main surface 10a is substantially the same as the channel length described above, and for example, approximately not smaller than 0.2 µm and not greater than 0.6 µm. Mask layer 4 is an ion implantation mask which will be described later and composed, for example, of silicon dioxide or a resist.

Figure 10:
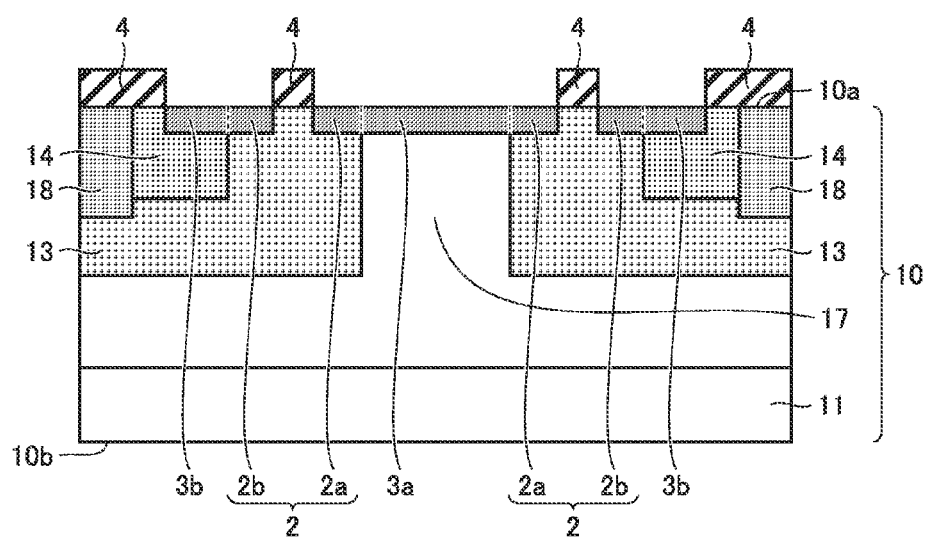
FIG. 10 is a schematic cross-sectional view schematically showing a third step in the method for manufacturing a silicon carbide semiconductor device according to one embodiment of the present invention.
Figure 11:
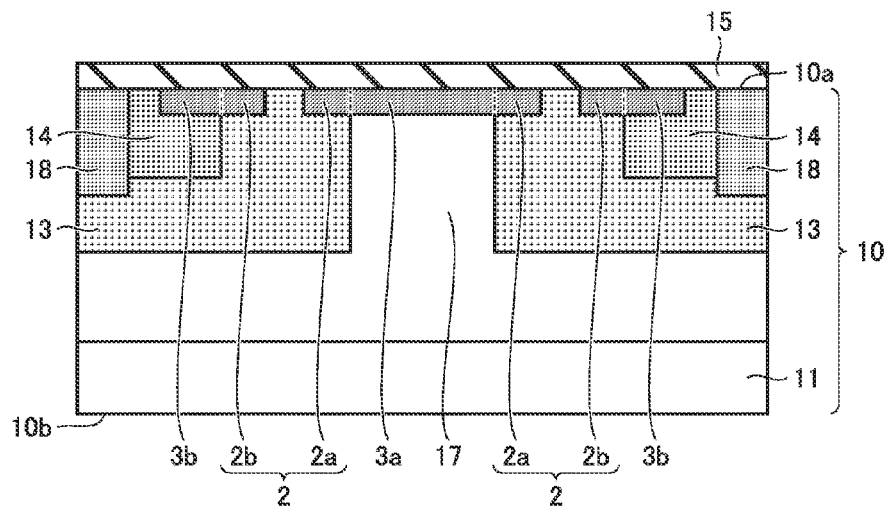
FIG. 11 is a schematic cross-sectional view schematically showing a fourth step in the method for manufacturing a silicon carbide semiconductor device according to one embodiment of the present invention.
Figure 12:
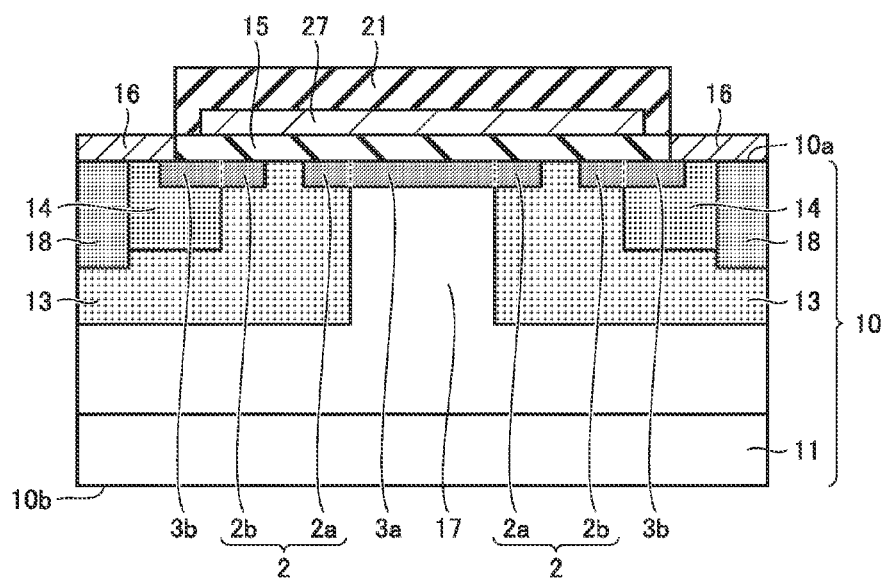
FIG. 12 is a schematic cross-sectional view schematically showing a fifth step in the method for manufacturing a silicon carbide semiconductor device according to one embodiment of the present invention.

Then, a protruding region forming step (S30: FIG. 7) is performed. Referring to FIG. 10, with the use of mask layer 4, protruding region 2 in contact at least with body region 13 is formed. Specifically, with the use of mask layer 4, such an impurity (donor) as phosphorus ions is introduced into body region 13, so that first protruding region 2a protruding from the side of drift region 17 into body region 13 and being in contact with first main surface 10a and second protruding region 2b protruding from the side of source region 14 into body region 13 and being in contact with first main surface 10a are formed. Preferably, protruding region 2 is formed through ion implantation. Preferably, first protruding region 2a and second protruding region 2b are simultaneously formed. Protruding region 2 is formed to protrude from at least one side of source region 14 and drift region 17 into body region 13.

As described above, each of first protruding region 2a and second protruding region 2b is in contact with gate insulating layer 15 and has the n-type (the first conductivity type). Protruding region 2 contains such an impurity (donor) as phosphorus. A concentration of the impurity (donor) contained in protruding region 2 is higher than a concentration of the impurity (acceptor) contained in body region 13. A concentration of the impurity (donor) in protruding region 2 is, for example, approximately $1\times10^{18}$ cm$^{-3}$.

Preferably, the step of forming protruding region 2 includes the steps of forming first protruding region 2a arranged to protrude from the side of drift region 17 into body region 13 and forming first $n^+$ region 3a protruding from first protruding region 2a into drift region 17, being in contact with first main surface 10a, and being higher in impurity concentration than drift region 17. In the step of forming first protruding region 2a, preferably, first $n^+$ region 3a protruding from first protruding region 2a into drift region 17, being in contact with first main surface 10a, and being higher in impurity concentration than drift region 17 is formed simultaneously with first protruding region 2a. In the step of forming second protruding region 2b, preferably, second $n^+$ region 3b protruding from second protruding region 2b into source region 14, being in contact with first main surface 10a, and being higher in impurity concentration than drift region 17 is formed simultaneously with second protruding region 2b. More preferably, first protruding region 2a, second protruding region 2b, first $n^+$ region 3a, and second $n^+$ region 3b are simultaneously formed.

Then, an activation annealing step is performed. Specifically, heat treatment for heating silicon carbide layer 10 to, for example, around 1700° C. and holding the silicon carbide layer for approximately 30 minutes in an atmosphere of such an inert gas as argon is performed. The implanted impurity is thus activated. As above, silicon carbide layer 10 having first main surface 10a and second main surface 10b is formed. Silicon carbide layer 10 includes drift region 17 having the n-type (the first conductivity type), body region 13 having the p-type (the second conductivity type) and being in contact with drift region 17, source region 14 having the n-type and arranged as being spaced apart from drift region 17 by body region 13, and protruding region 2 arranged to protrude from at least one side of source region 14 and drift region 17 into body region 13, being in contact with first main surface 10a, and having the n-type.

Then, a gate insulating film forming step (S40: FIG. 7) is performed. Specifically, referring to FIG. 11, heat treatment for heating main surface 10a of silicon carbide layer 10 to, for example, a temperature approximately not lower than 1200° C. and approximately not higher than 1300° C. and holding the silicon carbide layer for approximately 60 minutes, for example, in an oxygen atmosphere is performed. Thus, gate insulating layer 15 being in contact with first main surface 10a of silicon carbide layer 10 and composed of silicon dioxide is formed. Gate insulating layer 15 is formed to be in contact with first protruding region 2a, second protruding region 2b, drift region 17, source region 14, $p^+$ region 18, first $n^+$ region 3a, and second $n^+$ region 3b, at first main surface 10a. As shown in FIGS. 2 to 4, gate insulating layer 15 may be formed to be in contact with drift region 17 at first main surface 10a.

Then, a nitrogen annealing step is performed. Specifically, silicon carbide layer 10 is held, for example, for approximately 1 hour at a temperature not lower than 1300° C. and not higher than 1500° C. in an atmosphere of nitric oxide. Thereafter, heat treatment for heating silicon carbide layer 10 is performed in an inert gas such as argon or nitrogen. In the heat treatment, silicon carbide layer 10 is held for approximately 1 hour at a temperature not lower than 1100° C. and not higher than 1500° C.

Then, a gate electrode forming step (S50: FIG. 7) is performed. Specifically, referring to FIG. 12, gate electrode 27 composed of polysilicon which is a conductor to which an impurity has been added at a high concentration is formed, for example, through CVD, photolithography, and etching. Thereafter, interlayer insulating film 21 composed of silicon dioxide representing an insulator is formed to surround gate electrode 27, for example, with CVD. Then, interlayer insulating film 21 and gate insulating layer 15 in a region where source contact electrode 16 is to be formed are removed through photolithography and etching.

Then, an ohmic electrode forming step (S60: FIG. 7) is performed. Specifically, a metal film formed, for example, with vapor deposition is formed to be in contact with source region 14 and $p^+$ region 18 at main surface 10a of silicon carbide layer 10. The metal film may contain, for example, Ti (titanium) atoms, Al (aluminum) atoms, and Si (silicon) atoms. The metal film may contain, for example, Ni atoms and Si atoms. After the metal film is formed, the metal film is heated, for example, at approximately 1000° C. Then, the metal film is heated and silicided. Thus, source contact electrode 16 in ohmic contact with source region 14 of silicon carbide layer 10 is formed. Similarly, a metal film, for example, of Ni is formed to be in contact with second main surface 10b of silicon carbide layer 10, and drain electrode 20 in ohmic contact with silicon carbide layer 10 is formed by heating the metal film.

Then, source interconnection 19 composed of Al representing a conductor is formed to surround interlayer insulating film 21 and to be in contact with source contact electrode 16, for example, through vapor deposition. Pad electrode 23 composed, for example, of Al is formed to be in contact with drain electrode 20. Through the procedure above, MOSFET 1 (see FIG. 1) according to the present embodiment is completed.

Though a case that the n-type is defined as the first conductivity type and the p-type is defined as the second conductivity type has been described in the present embodiment, the p-type may be defined as the first conductivity type and the n-type may be defined as the second conductivity type.

Though a planar MOSFET has been described in the present embodiment by way of example of a silicon carbide semiconductor device, the present invention is not limited to this form. For example, the silicon carbide semiconductor device may be a trench MOSFET or an insulated gate bipolar transistor (IGBT). The silicon carbide semiconductor device may be a vertical semiconductor device.

A function and effect of MOSFET 1 and the method for manufacturing the same according to the present embodiment will now be described.

According to MOSFET 1 in the present embodiment, silicon carbide layer 10 includes protruding region 2 arranged to protrude from at least one side of source region 14 and drift region 17 into body region 13, being in contact with gate insulating layer 15, and having the n-type. Thus, a threshold voltage can be improved while increase in specific on-resistance of MOSFET 1 is suppressed.

According to MOSFET 1 in the present embodiment, protruding region 2 includes first protruding region 2a arranged to protrude from a side of drift region 17 into body region 13 and second protruding region 2b arranged to protrude from a side of source region 14 into body region 13. Thus, effectively, a threshold voltage can be improved while increase in specific on-resistance of MOSFET 1 is suppressed.

According to MOSFET 1 in the present embodiment, dimension La of first protruding region 2a along the direction in parallel to main surface 10a is greater than dimension Tch of the first protruding region along the direction perpendicular to the main surface, and dimension Lb of second protruding region 2b along the direction in parallel to the main surface is greater than dimension Tch of second protruding region 2b along the direction perpendicular to the main surface. Thus, an electron or hole pull effect in a portion of first protruding region 2a and second protruding region 2b opposite to a side in contact with main surface 10a is higher than an electron or hole pull effect in a portion of first protruding region 2a and second protruding region 2b on a side of the channel region. Therefore, extension of a depletion layer extending from each of first protruding region 2a and second protruding region 2b toward the channel region can be lessened.

According to MOSFET 1 in the present embodiment, dimension Tch of each of first protruding region 2a and second protruding region 2b along the direction perpendicular to main surface 10a is smaller than half dimension Ts of source region 14 along the direction perpendicular to main surface 10a. Thus, a threshold voltage can be improved while increase in specific on-resistance of the silicon carbide semiconductor device is suppressed.

According to MOSFET 1 in the present embodiment, dimension Tch of each of first protruding region 2a and second protruding region 2b along the direction perpendicular to the main surface is smaller than 100 nm. Thus, the protruding region is more likely to allow the depletion layer to extend in the vertical direction, while the depletion layer is less likely to extend in the horizontal direction. Therefore, a short-channel effect can be suppressed.

According to MOSFET 1 in the present embodiment, in body region 13, a length of channel region CH being in contact with main surface 10a and lying between first protruding region 2a and second protruding region 2b is smaller than 0.5 μm. Thus, a specific on-resistance can effectively be lowered.

According to MOSFET 1 in the present embodiment, in body region 13, a length of channel region CH being in contact with main surface 10a and lying between first protruding region 2a and second protruding region 2b is smaller than length Lch1 of the channel region corresponding to threshold voltage Vth3 which is 90% of ideal threshold voltage Vth4. Thus, a resistance in the channel region can be lowered.

According to MOSFET 1 in the present embodiment, protruding region 2 is arranged to protrude from one side of source region 14 and drift region 17 into body region 13. Thus, a threshold voltage can be improved while increase in specific on-resistance of the silicon carbide semiconductor device is suppressed.

According to MOSFET 1 in the present embodiment, protruding region 2 is arranged to protrude from a side of drift region 17 into body region 13, and silicon carbide layer 10 further includes first-conductivity-type region 3a protruding from protruding region 2 into drift region 17, being in contact with gate insulating layer 15, and being higher in impurity concentration than drift region 17. Thus, a specific on-resistance can effectively be lowered.

According to MOSFET 1 in the present embodiment, dimension La of protruding region 2 along the direction in parallel to main surface 10a is greater than dimension Tch of protruding region 2 along the direction perpendicular to main surface 10a. Thus, an electron or hole pull effect in a portion of protruding region 2 opposite to a side in contact with main surface 10a is higher than an electron or hole pull effect in a portion of protruding region 2 on a side of the channel region. Therefore, extension of a depletion layer extending from protruding region 2 toward the channel region can be lessened.

According to MOSFET 1 in the present embodiment, dimension Tch of protruding region 2 along the direction perpendicular to main surface 10a is smaller than half dimension Ts of source region 14 along the direction perpendicular to main surface 10a. Thus, a threshold voltage can be improved while increase in specific on-resistance of the silicon carbide semiconductor device is suppressed.

According to MOSFET 1 in the present embodiment, dimension Tch of protruding region 2 along the direction perpendicular to main surface 10a is smaller than 100 nm. Thus, the protruding region is more likely to allow the depletion layer to extend in the vertical direction, while the depletion layer is less likely to extend in the horizontal direction. Therefore, a short-channel effect can be suppressed.

According to MOSFET 1 in the present embodiment, in body region 13, a length of channel region CH being in contact with main surface 10a and lying between protruding region 2 and end portion 13c, 13d of body region 13 opposed to protruding region 2 is smaller than 0.5 μm. Thus, a specific on-resistance can effectively be lowered.

According to MOSFET 1 in the present embodiment, in body region 13, a length of channel region CH being in contact with main surface 10a and lying between protruding region 2 and end portion 13c, 13d of body region 13 opposed to protruding region 2 is smaller than length Lch1 of the channel region corresponding to threshold voltage Vth3 which is 90% of ideal threshold voltage Vth4. Thus, a resistance in the channel region can be lowered.

According to MOSFET 1 in the present embodiment, protruding region 2 is higher in impurity concentration than body region 13. Thus, protruding region 2 can be formed after body region 13 is formed.

According to MOSFET 1 in the present embodiment, an n-type is defined as the first conductivity type and a p-type is defined as the second conductivity type. Thus, ease in manufacturing of a silicon carbide semiconductor device can be improved.

A method for manufacturing a silicon carbide semiconductor device according to the embodiment includes the steps below. Silicon carbide layer 10 having main surface 10a is formed. Gate insulating layer 15 in contact with main surface 10a of silicon carbide layer 10 is formed. Silicon carbide layer 10 includes drift region 17 having the first conductivity type, body region 13 having the second conductivity type different from the first conductivity type and being in contact with drift region 17, source region 14 having the first conductivity type and arranged as being spaced apart from drift region 17 by body region 13, and protruding region 2 arranged to protrude from at least one side of source region 14 and drift region 17 into body region 13, being in contact with main surface 10a, and having the first conductivity type.

According to the method for manufacturing MOSFET 1 in the present embodiment, protruding region 2 arranged to protrude from at least one side of source region 14 and drift region 17 into body region 13, being in contact with main surface 10a, and having the first conductivity type is included. Thus, a threshold voltage can be improved while increase in specific on-resistance of MOSFET 1 is suppressed.

In the method for manufacturing MOSFET 1 according to the present embodiment, the step of forming silicon carbide layer 10 includes the steps of forming mask layer 4 in contact with body region 13 at main surface 10a and forming protruding region 2 in contact at least with body region 13 by using mask layer 4. When protruding region 2 is not included, a channel length is determined by a position of a boundary between the source region and the body region and a position of a boundary between the body region and the drift region. Namely, since the channel length is affected by misalignment of both of the source region and the body region, variation in channel length is great. When protruding region 2 is formed with the use of mask layer 4, a channel length is controlled by a width of mask layer 4. Therefore, variation in channel length can be lessened.

In the method for manufacturing MOSFET 1 according to the present embodiment, the step of forming protruding region 2 includes the steps of forming first protruding region 2a arranged to protrude from a side of drift region 17 into body region 13 and forming first $n^+$ region 3a protruding from first protruding region 2a into drift region 17, being in contact with main surface 10a, and being higher in impurity concentration than drift region 17, and the step of forming first protruding region 2a and the step of forming first $n^+$ region 3a are simultaneously performed. Thus, MOSFET 1 capable of achieving effective lowering in specific on-resistance can efficiently be manufactured.

In the method for manufacturing MOSFET 1 according to the present embodiment, the step of forming protruding region 2 is performed by implanting ions. Thus, protruding region 2 can efficiently be formed.

Example

Figure 13:
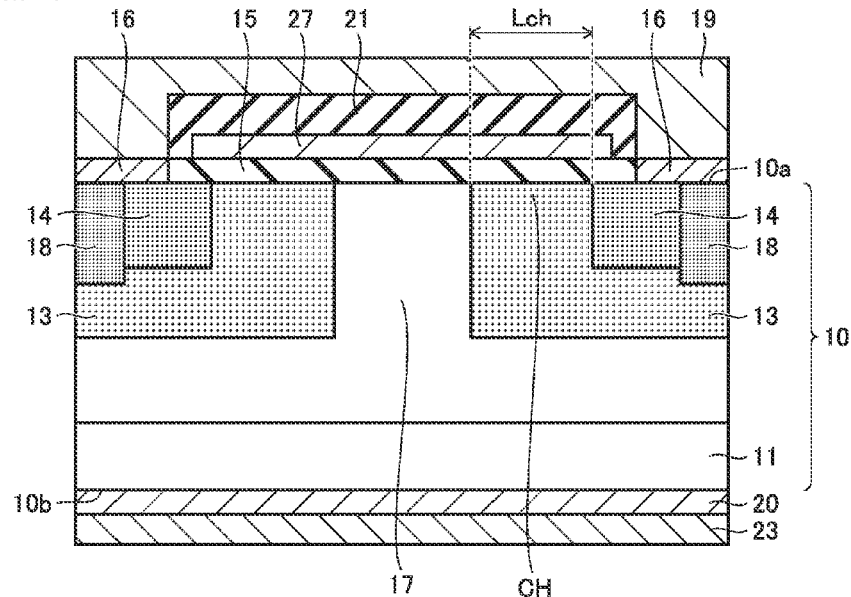
FIG. 13 is a schematic cross-sectional view schematically showing a structure of a silicon carbide semiconductor device according to a comparative example.

In the present example, relation between a specific on-resistance and a weak inversion threshold voltage was investigated with the use of MOSFETs according to a comparative example and a present inventive example. The MOSFET according to the comparative example does not have protruding region 2, whereas the MOSFET according the present inventive example has protruding region 2. Namely, how relation between a specific on-resistance and a threshold voltage varies depending on whether or not protruding region 2 is present was investigated. Initially, as the comparative example, a MOSFET having a structure as shown in FIG. 13 was prepared. Channel length Lch of the MOSFET having that structure is equal to a length of channel region CH in contact with first main surface 10a in body region 13 lying between source region 14 and drift region 17. As the comparative example, sample 1 to sample 4 were prepared. Then, as the present inventive example, a MOSFET having the structure as shown in FIG. 1 was prepared. As the present inventive example, sample 5 to sample 7 were prepared. Four pieces for each sample were prepared. A concentration in the channel region (p body region 13) in each of sample 1 to sample 7 was set to $3 \times 10^{17}$ $cm^{-3}$. Reticle design values Lch for channel lengths in sample 1 to sample 7 were set to −0.1 µm, 0 µm, 0.1 µm, 0.2 µm, 0.6 µm, 0.8 µm, and 1.2 µm, respectively. An actual channel length is deviated from the reticle design value for the channel length. An actual channel length is expected to have a value calculated by adding 0.2 µm to 0.5 µm, with an effect of lateral scattering dependent on injected energy being added to the reticle design value for the channel length.

A specific on-resistance and a weak inversion threshold voltage of the MOSFETs in each of samples 1 to 7 were measured. Relation between a specific on-resistance and a weak inversion threshold voltage will be described with reference to FIG. 14.

Figure 14:
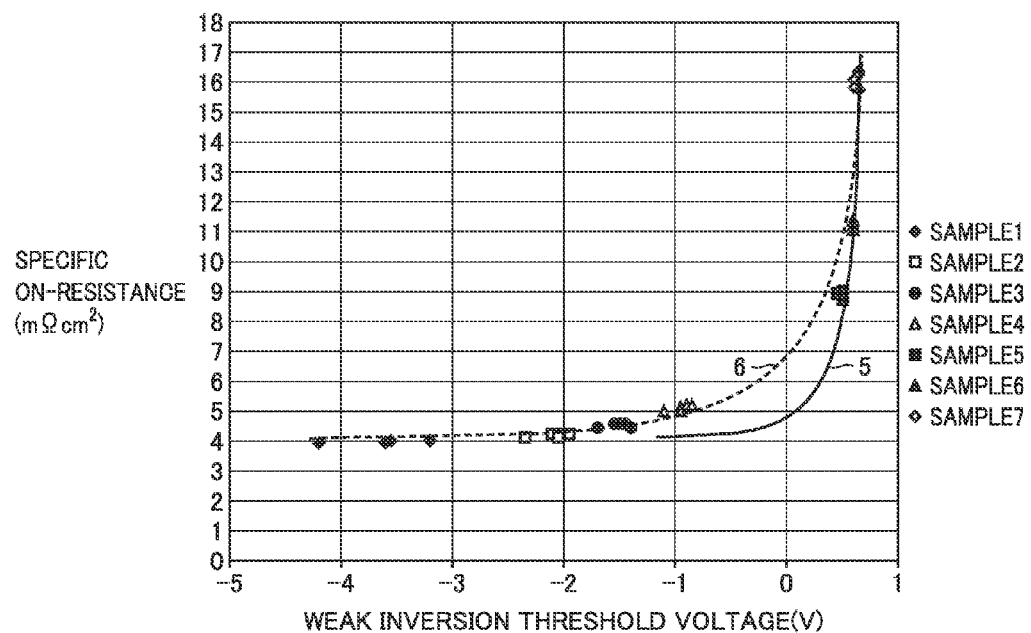
FIG. 14 is a diagram showing relation between a specific on-resistance and a weak inversion threshold voltage of silicon carbide semiconductor devices according to the comparative example and one embodiment of the present invention.

A specific on-resistance and a weak inversion threshold voltage of each of sample 1 to sample 4 according to the comparative example are located on a dashed curve 6, and a specific on-resistance and a weak inversion threshold voltage of each of samples 5 to 7 according to the present inventive example are located on a solid curve 5. Desirable characteristics of the MOSFET include a low specific on-resistance and a high threshold voltage. As shown in FIG. 14, the MOSFETs according to the present inventive example were confirmed to be higher in threshold voltage than the MOSFETs according to the comparative example, based on comparison at the same specific on-resistance.

It should be understood that the embodiment and the example disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 1 silicon carbide semiconductor device (MOSFET); 2 protruding region; 2a first protruding region; 2b second protruding region; 3a first n$^+$ region (first-conductivity-type region); 3b second n$^+$ region; 4 mask layer; 10 silicon carbide layer; 10a first main surface (main surface); 10b second main surface; 11 base substrate; 13 body region; 14 source region; 15 gate insulating layer; 16 source contact electrode; 17 drift region; 18 p$^+$ region; 19 source interconnection; 20 drain electrode; 21 interlayer insulating film; 23 pad electrode; 27 gate electrode; and CH channel region.

The invention claimed is:

1. A silicon carbide semiconductor device, comprising:
a silicon carbide layer having a main surface; and
a gate insulating layer arranged as being in contact with said main surface of said silicon carbide layer,
said silicon carbide layer including a drift region having a first conductivity type, a body region having a second conductivity type different from said first conductivity type and being in contact with said drift region, a source region having said first conductivity type and arranged as being spaced apart from said drift region by said body region, and a protruding region arranged to protrude from at least one side of said source region and said drift region into said body region, being in contact with said gate insulating layer, and having said first conductivity type,
wherein the protruding region has a pair of protruding region portions opposed to each other in a cross-sectional view, and
wherein a portion of the drift region is provided between the pair of protruding region portions.

2. The silicon carbide semiconductor device according to claim 1, wherein
said protruding region includes a first protruding region arranged to protrude from a side of said drift region into said body region and a second protruding region arranged to protrude from a side of said source region into said body region.

3. The silicon carbide semiconductor device according to claim 2, wherein
a dimension of said first protruding region along a direction in parallel to said main surface is greater than a dimension of said first protruding region along a direction perpendicular to said main surface and a dimension of said second protruding region along the direction in parallel to said main surface is greater than a dimension of said second protruding region along the direction perpendicular to said main surface.

4. The silicon carbide semiconductor device according to claim 2, wherein
a dimension of each of said first protruding region and said second protruding region along a direction perpendicular to said main surface is smaller than half a dimension of said source region along the direction perpendicular to said main surface.

5. The silicon carbide semiconductor device according to claim 2, wherein
a dimension of each of said first protruding region and said second protruding region along a direction perpendicular to said main surface is smaller than 100 nm.

6. The silicon carbide semiconductor device according to claim 2, wherein
in said body region, a length of a channel region being in contact with said main surface and lying between said first protruding region and said second protruding region is smaller than 0.5 µm.

7. The silicon carbide semiconductor device according to claim 2, wherein in said body region, a length of a channel region being in contact with said main surface and lying between said first protruding region and said second protruding region is smaller than a length of said channel region corresponding to a threshold voltage which is 90% of an ideal threshold voltage, wherein the ideal threshold voltage is a threshold voltage to which the threshold voltage is asymptotic when a channel length is increased.

8. The silicon carbide semiconductor device according to claim 1, wherein
said protruding region is arranged to protrude from one side of said source region and said drift region into said body region.

9. The silicon carbide semiconductor device according to claim 8, wherein
said protruding region is arranged to protrude from a side of said drift region into said body region, and
said silicon carbide layer further includes a first-conductivity-type region protruding from said protruding region into said drift region, being in contact with said gate insulating layer, and being higher in impurity concentration than said drift region.

10. The silicon carbide semiconductor device according to claim 8, wherein
a dimension of said protruding region along a direction in parallel to said main surface is greater than a dimension of said protruding region along a direction perpendicular to said main surface.

11. The silicon carbide semiconductor device according to claim 8, wherein
a dimension of said protruding region along a direction perpendicular to said main surface is smaller than half a dimension of said source region along the direction perpendicular to said main surface.

12. The silicon carbide semiconductor device according to claim 8, wherein
a dimension of said protruding region along a direction perpendicular to said main surface is smaller than 100 nm.

13. The silicon carbide semiconductor device according to claim 8, wherein
in said body region, a length of a channel region being in contact with said main surface and lying between said protruding region and an end portion of said body region opposed to said protruding region is smaller than 0.5 µm.

14. The silicon carbide semiconductor device according to claim 8, wherein
in said body region, a length of a channel region being in contact with said main surface and lying between said protruding region and an end portion of said body region opposed to said protruding region is smaller than a length of said channel region corresponding to a threshold voltage which is 90% of an ideal threshold voltage, wherein the ideal threshold voltage is a threshold voltage to which the threshold voltage is asymptotic when a channel length is increased.

15. The silicon carbide semiconductor device according to claim 1, wherein
said protruding region is higher in impurity concentration than said body region.

16. The silicon carbide semiconductor device according to claim 1, wherein
an n-type is defined as said first conductivity type and a p-type is defined as said second conductivity type.

17. A method for manufacturing a silicon carbide semiconductor device, comprising the steps of:
forming a silicon carbide layer having a main surface; and
forming a gate insulating layer in contact with said main surface of said silicon carbide layer,
said silicon carbide layer including a drift region having a first conductivity type, a body region having a second conductivity type different from said first conductivity type and being in contact with said drift region, a source region having said first conductivity type and arranged as being spaced apart from said drift region by said body region, and a protruding region arranged to protrude from at least one side of said source region and said drift region into said body region, being in contact with said main surface, and having said first conductivity type,
wherein the protruding region has a pair of protruding region portions opposed to each other in a cross-sectional view, and
wherein a portion of the drift region is provided between the pair of the protruding region portions.

18. The method for manufacturing a silicon carbide semiconductor device according to claim 17, wherein
said step of forming a silicon carbide layer includes the steps of forming a mask layer in contact with said body region at said main surface and forming said protruding region in contact at least with said body region by using said mask layer.

19. The method for manufacturing a silicon carbide semiconductor device according to claim 18, wherein
said step of forming said protruding region includes the steps of forming a first protruding region arranged to protrude from a side of said drift region into said body region and forming a first-conductivity-type region protruding from said first protruding region into said drift region, being in contact with said main surface, and being higher in impurity concentration than said drift region, and
said step of forming a first protruding region and said step of forming a first-conductivity-type region are simultaneously performed.

20. The method for manufacturing a silicon carbide semiconductor device according to claim 17, wherein
said step of forming said protruding region is performed by implanting ions.

* * * * *